United States Patent
Nasu

(10) Patent No.: US 9,659,887 B2
(45) Date of Patent: May 23, 2017

(54) SEMICONDUCTOR DEVICE

(71) Applicant: LAPIS Semiconductor Co., Ltd., Yokohama (JP)

(72) Inventor: Nobutaka Nasu, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/231,030

(22) Filed: Aug. 8, 2016

(65) Prior Publication Data

US 2016/0343678 A1 Nov. 24, 2016

Related U.S. Application Data

(63) Continuation of application No. 14/799,564, filed on Jul. 14, 2015, now Pat. No. 9,443,811.

(30) Foreign Application Priority Data

Jul. 15, 2014 (JP) .................. 2014-145152

(51) Int. Cl.
*H01L 23/00* (2006.01)

(52) U.S. Cl.
CPC .............. *H01L 24/06* (2013.01); *H01L 24/49* (2013.01); *H01L 2224/04042* (2013.01); *H01L 2224/0557* (2013.01); *H01L 2224/05548* (2013.01); *H01L 2224/05553* (2013.01); *H01L 2224/06155* (2013.01); *H01L 2224/06515* (2013.01); *H01L 2224/0801* (2013.01); *H01L 2224/09515* (2013.01); *H01L 2924/00014* (2013.01)

(58) Field of Classification Search
CPC ....... H01L 2924/00; H01L 2224/48247; H01L 24/05; H01L 23/06; H01L 2224/06155; H01L 2224/05553; H01L 2224/05548; H01L 2224/0801; H01L 2224/0557; H01L 2224/04042; H01L 2224/05095; H01L 2224/48227; H01L 2224/49175; H01L 2224/05096; H01L 2224/45099; H01L 2924/00012

See application file for complete search history.

(56) References Cited

U.S. PATENT DOCUMENTS

| 6,953,997 | B1 * | 10/2005 | Merigot | .................. | H01L 24/06 |
| | | | | | 257/203 |
| 7,064,450 | B1 | 6/2006 | Eghan et al. | | |
| 2006/0091535 | A1 | 5/2006 | Tsao et al. | | |

FOREIGN PATENT DOCUMENTS

| JP | H03-82129 A | 4/1991 |
| JP | 2004-179184 A | 6/2004 |
| JP | 2012-235048 A | 11/2012 |

* cited by examiner

*Primary Examiner* — Jasmine Clark
(74) *Attorney, Agent, or Firm* — Rabin & Berdo, P.C.

(57) ABSTRACT

A semiconductor device includes a pad group including pads provided on a semiconductor substrate and arranged in a row to form a pad row as a whole. The pad group includes at least one first pad provided with a first via-connection part electrically connected therewith and extending in a first direction perpendicular to a row direction of the pad row, and at least one second pad provided with a second via-connection part electrically connected therewith and extending in a second direction opposite to the first direction. The at least one second pad is formed at a position moved in the first direction from the row direction of the pad row passing through a center of the at least one first pad.

12 Claims, 4 Drawing Sheets

SEMICONDUCTOR DEVICE

CROSS-REFERENCE TO RELATED APPLICATION

This is a continuation of U.S. application Ser. No. 14/799,564, filed on Jul. 14, 2015, now U.S. Pat. No. 9,443,811. This application claims priority under 35 USC 119 of Japanese Patent Application No. 2014-145152, filed on Jul. 15, 2014. The disclosures of these prior applications are incorporated by reference herein by reference.

BACKGROUND OF THE INVENTION

1. Field of the Invention

The present invention relates to a semiconductor device and, in particular, to a pad layout in a semiconductor device.

2. Background Art

Semiconductor devices, such as semiconductor integrated circuits, have incorporated increasingly complicated circuit blocks along with increases in their functionality and scale. Moreover, a greater number of pads have been provided as a connection interface with an external device in such a semiconductor device. Therefore, to reduce the size of such a semiconductor device, it is necessary not only to form a finer circuit block but also to create device design including a pad layout and wiring from the pads to the circuit block.

For example, Japanese Patent Application Laid-Open No. 2004-179184 discloses a semiconductor integrated circuit including: an internal cell region formed in a central part of a substrate; a plurality of input and output cells formed around the internal cell region and arranged in a plurality of rows; and a plurality of pads formed in a peripheral portion of the substrate, in which input and output cells constituting a relatively-inner input and output cell row are connected to the pads via wiring formed above input and output cells constituting a relatively-outer input and output cell row.

Japanese Patent Application Laid-Open No. 2012-235048 discloses a semiconductor device including: a plurality of first buffer cells provided in a row along one side of a substrate; a plurality of second buffer cells provided in a row along the arrangement direction of the plurality of first buffer cells at positions closer to a center of the substrate than the plurality of first buffer cells; a plurality of first pads provided in a row above the plurality of first buffer cells; and a plurality of second pads provided in a row at positions closer to the center of the substrate than the plurality of first buffer cells, in which the plurality of second pads include: a plurality of third pads each individually connected to any one of the plurality of first buffer cells; and a plurality of fourth pads each individually connected to any one of the plurality of second buffer cells.

SUMMARY OF THE INVENTION

Semiconductor devices each typically include a multilayered wiring layer. Pads and wiring from the pads to a circuit block are provided in this multilayered wiring layer. When a semiconductor device is manufactured by providing a multilayered wiring layer on a substrate and a circuit structure layer in which a circuit block is formed, for example, pads are formed on a surface of the multilayered wiring layer. Moreover, the pads are connected to the circuit block by means of metal wiring provided in the multilayered wiring layer. A plurality of through holes are provided in the multilayered wiring layer, and the metal wiring is connected to other wiring layers via the through holes.

On the other hand, a bonding wire is formed on the pad. Thus, at the time of wire bonding to the pad, a head of a bonding apparatus is brought into contact with the pad. Also, before the wire bonding, a probe is brought into contact with the pad when the function of the device is tested. Since physical force is applied on the pad at the time of manufacturing as described above, it is preferable that no through hole directly connected to an internal circuit be formed immediately below the pad.

Moreover, in order to perform the above-described wire bonding and probing test, no passivation film is provided on the pad at least at the time of manufacturing. Thus, if a through hole directly connected to the internal circuit is provided immediately below the pad, the above-described physical force may deform the through hole and a foreign substance such as water may enter the through hole at the time of manufacturing. Due to such quality reasons, a pad is provided with a part extended from its pad region, the extended part is protected by a passivation film, and a through hole is provided under the extended part.

To achieve reduction in device size, it is desirable to study a layout, including not only the size, shape, and arrangement of the pads but also the extended parts.

The present invention has been made in view of the above and it is an object of the present invention to provide a semiconductor device having an optimized layout for pads and extended parts and thus capable of achieving reduction in device size.

A semiconductor device according to the present invention includes a pad group including a plurality of pads provided on a semiconductor substrate and arranged in a row to form a pad row as a whole. The pad group includes: at least one first pad provided with a first via-connection part electrically connected therewith and extended in a first direction perpendicular to a row direction of the pad row; and at least one second pad provided with a second via-connection part electrically connected therewith and extended in a second direction opposite to the first direction. The at least one second pad is formed at a position moved in the first direction from the row direction of the pad row passing through a center of the at least one first pad.

A semiconductor device according to an embodiment of the present invention allows the layout of a pad region, including pads and extended parts, to be optimized, allows a principal surface of a wiring layer to be effectively utilized without wasted space, and allows wiring efficiency to be optimized. Thus, reduction in device size can be achieved.

DETAILED DESCRIPTION OF THE INVENTION

An embodiment of the present invention will now be described below in detail.

First Embodiment

Figure 1A:
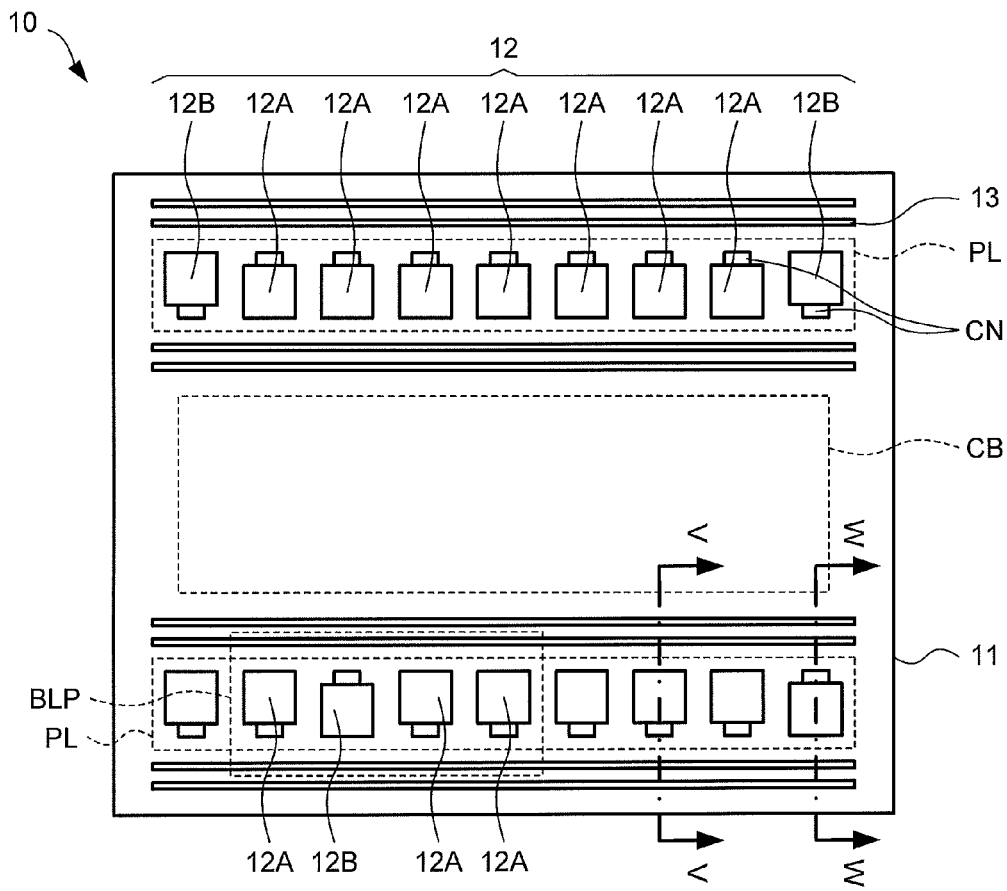
FIG. 1A is a schematic diagram illustrating an upper surface of a semiconductor device according to a first embodiment.

FIG. 1A is a schematic diagram illustrating an upper surface of a semiconductor device 10 according to the first embodiment. The semiconductor device 10 has a configuration in which a circuit block CB is formed in a semiconductor substrate (hereinafter referred to simply as a substrate) 11. The circuit block CB is formed in the center of the substrate 11 as seen from a direction perpendicular to the substrate 11, i.e., as seen from the top. The present embodiment describes a case where the substrate 11 and the circuit block CB each have a rectangular shape as seen from the top.

The semiconductor device 10 includes a pad group 12 constituted by a plurality of pads. Each of the plurality of pads is provided with a connection part (via-connection part) CN extended from the pad and connected to wiring to the circuit block CB. The connection parts CN constitute extended parts of the pads. The plurality of pads are arranged in a row and form, together with the connection parts CN, a pad row PL as a whole. The connection parts CN are formed extending from the pads along a direction perpendicular to a longitudinal direction (row direction) of the pad row PL (i.e., a short direction).

Note that the present embodiment describes a case where the pad group 12 is formed in the outside of the circuit block CB as seen from the top. Moreover, the present embodiment describes a case where two pad rows PL are formed along two opposed sides of the substrate 11. Moreover, the present embodiment describes a case where the pad group 12 is formed along a peripheral portion of the circuit block CB. Moreover, the present embodiment describes a case where the pads in the pad group 12 each have a rectangular shape and the same length in the short direction of the pad row PL and the connection parts CN each have a rectangular shape and the same length in the short direction of the pad row PL.

In the present embodiment, among the pads in the pad group 12, a pad having the connection part CN formed on the side of a peripheral portion of the substrate 11 is referred to as a pad 12A (first pad). Similarly, a pad having the connection part CN formed on the side of the circuit block CB (on the side opposite to the pad 12A) is referred to as a pad 12B (second pad). The pad group 12 includes at least one first pad 12A and at least one second pad 12B.

The semiconductor device 10 includes a surface wire 13 provided adjacent to a longer side of the pad group 12. A plurality of surface wires 13 are formed so as to sandwich each pad row PL in a wiring layer having the same hierarchical level as the pad group 12 and the connection parts CN. A power-supply potential, for example, is inputted to the surface wire 13.

Figure 1B:
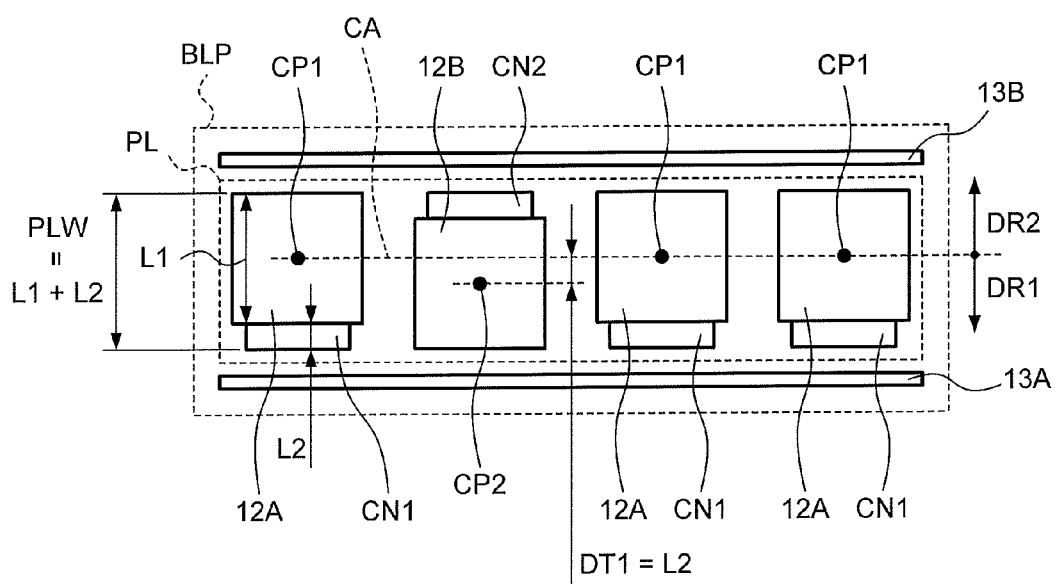
FIG. 1B is a partial enlarged view of FIG. 1A.

FIG. 1B is a partial enlarged view illustrating a portion BLP defined by a broken line in FIG. 1A in an enlarged manner. The pad group 12 is formed in a region (referred to as an inter-wire region) interposed between a pair of surface wires (first and second surface wires 13A and 13B). The first pad 12A is provided with a connection part (first via-connection part) CN1 electrically connected to the Pad 12A and extended from the pad 12A perpendicularly to the row direction of the pad row PL and toward an outer side of the substrate 11 (in a first direction DR1). Also, the second pad 12B is provided with a connection part (second via-connection part) CN2 electrically connected to the Pad 12B and extended from the pad 12B perpendicularly to the row direction of the pad row PL and toward an inner side of the substrate 11 (in a direction opposite to the first direction (in a second direction DR2)). The first and second connection parts CN1 and CN2 are connected to the circuit block CB provided in the substrate 11.

As shown in FIG. 1B, the pad 12B is formed at a position moved in the first direction DR1 from the row direction of the pad row PL passing through the center of the pad 12A by a length of the connection part CN1 along the first direction DR1. More specifically, the pad 12A has a center point CP1, which is the center of a region of the pad 12A. Similarly, the pad 12B has a center point CP2. The pads 12A and 12B each have a pad length L1, which is the length along the direction perpendicular to the row direction of the pad row PL. The connection parts CN1 and CN2 each have a connection part length L2, which is the length along the direction perpendicular to the row direction of the pad row PL.

As seen from the direction perpendicular to the substrate 11, the center point CP2 of the pad 12B is located at a position shifted in the first direction DR1 by a distance DT1 from a central axis CA formed by connecting the center points CP1 of the pads 12A. In the present embodiment, the distance DT1 equals the connection part length L2 of the connection part CN1 in the adjacent pad 12A. In other words, the pad 12B is arranged at a position moved in the first direction DR1, which is opposite to the second direction DR2, from the central axis CA by the connection part length L2 of the connection part CN1 in the adjacent pad 12A. The connection part length L2 is smaller than the pad length L1.

In this manner, the pads 12A and 12B are not arranged strictly in a straight line. However, the pads 12A and 12B and the connection parts CN1 and CN2 as a whole are arranged in a substantially straight line. Thus, a width PLW of the pad row PL constituted by the pads 12A and 12B and the connection parts CN1 and CN2, i.e., the distance of the pad row PL along the direction perpendicular to the longitudinal direction thereof is minimized. Specifically, the width PLW of the region of the pad row PL equals (the pad length L1)+(the connection part length L2). Moreover, the region of the pad row PL has a substantially rectangular shape with no protrusions and depressions as seen from the top. This allows the formation of simple wires, e.g., the linear formation of the surface wires 13 adjacent to the pad group 12, thus facilitating the wire formation.

If only the pads 12A and 12B are arranged in a straight line, an effective width of the region of the pad row PL equals (the pad length L1)+(the connection part length L2)+(the connection part length L2), thus substantially increasing the width of the region of the pad row PL. More specifically, a portion of the pad group 12 where the pad 12A is formed has a protrusion in the first direction DR1 and a portion thereof where the pad 12B is formed has a protrusion in the second direction DR2 in the region of the pad row PL. When the surface wires 13 are formed around such a pad row PL, the surface wires are bent along the protrusions, thus complicating the wire formation.

Note that the shift distance DT1 of the pad 12B is smaller than the pad length L1 in the present embodiment. In other words, the pad 12B is provided at a position moved from the central axis CA in the short direction of the pad row PL within a range not exceeding the pad length L1. Thus, as compared to when the pads 12A and 12B are formed strictly in a straight line, the positions of the pads 12A and 12B are not greatly changed. Therefore, when a probe card is manufactured so as to correspond to the positions of the pads, the needle assembling of the probe card is not limited to any type because of the small displacement between the pads in the present embodiment. Thus, there is a possibility of being able to employ, as a probe card for the semiconductor device 10 of the present embodiment, a probe card for testing the function of a semiconductor device in which the pads 12A and 12B are arranged in a straight line, for example.

Figure 2A:
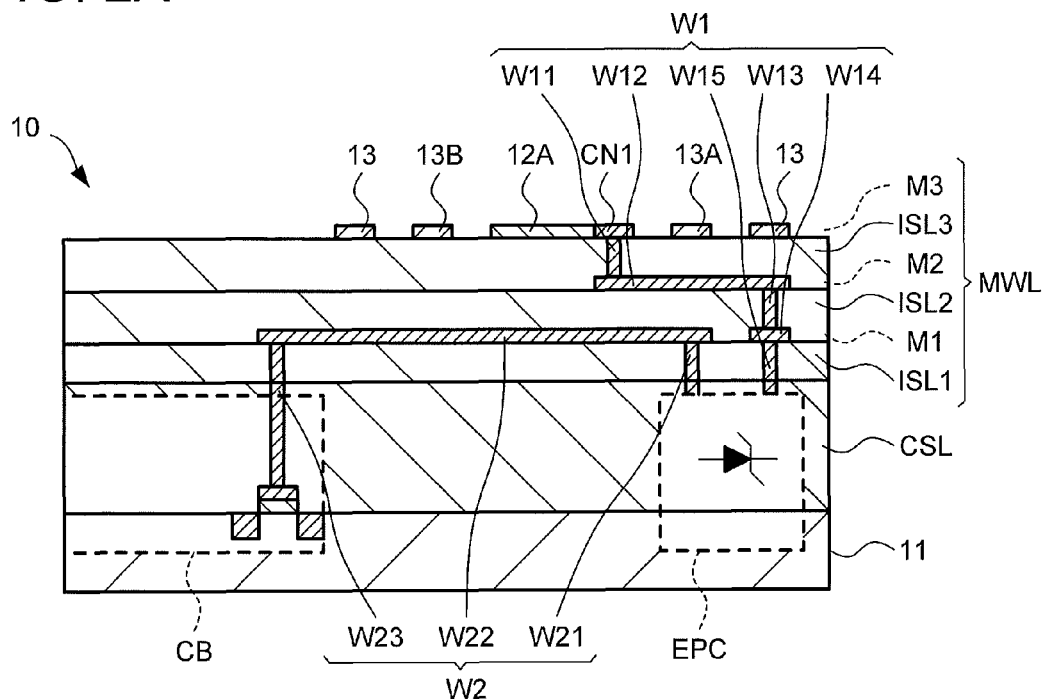
FIGS. 2A and 2B are cross-sectional views illustrating the semiconductor device according to the first embodiment.
Figure 2B:
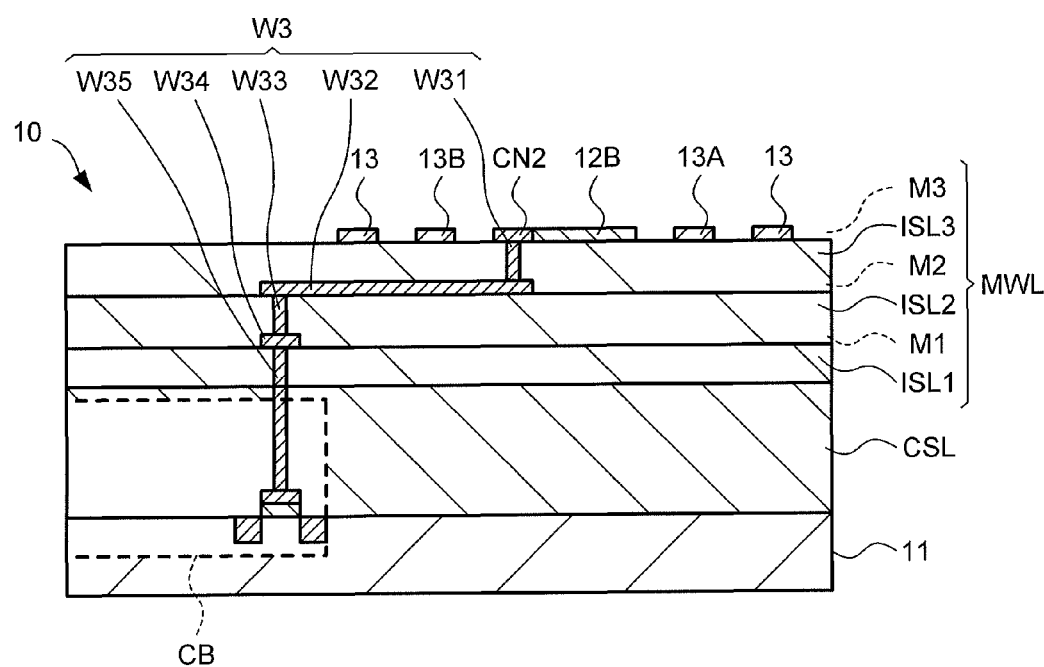

FIG. 2A is a cross-sectional view taken along line V-V in FIG. 1A. FIG. 2B is a cross-sectional view taken along line W-W in FIG. 1A. First, the configuration of the semiconductor device 10 will be described with reference to FIG. 2A. Note that the present embodiment describes a case where the semiconductor device 10 is a semiconductor memory such as a DRAM. First, a circuit structure layer CSL is formed on the substrate 11. The circuit block CB is formed in the substrate 11 and in the circuit structure layer CSL. The circuit block CB includes a transistor and a capacitor, for example. The circuit block CB is constituted by a memory cell array and a control circuit for controlling a storing operation of the memory cell array.

A multilayered wiring layer MWL, constituted by a plurality of metal wiring layers, is formed on the circuit structure layer CSL. The present embodiment describes a case where the multilayered wiring layer MWL has a configuration in which three metal wiring layers, i.e., a first metal wiring layer M1, a second metal wiring layer M2, and a third metal wiring layer M3, are formed on the circuit structure layer CSL. Specifically, the multilayered wiring layer MWL has a configuration in which a first insulating layer ISL1, the first metal wiring layer M1, a second insulating layer ISL2, the second metal wiring layer M2, a third insulating layer ISL3, and the third metal wiring layer M3 are sequentially layered in this order on the circuit structure layer CSL. Although not shown in the figure, the third metal wiring layer M3 is covered by a passivation film except for regions on the pads.

An example of connection between the first pad 12A in the pad group 12 and the circuit block CB will be described with reference to FIG. 2A. Note that FIG. 2A or 2B only shows connection between one pad 12A or 12B and the circuit block CB and connection wiring for other pads 12A and 12B is omitted.

The first pad 12A is connected to a first wiring group (first wiring to the circuit block CB) W1 in the multilayered wiring layer MWL by means of the connection part CN1 thereof. The first pad 12A is connected to an electro static discharge (ESD) protection circuit (hereinafter referred to simply as a protection circuit) EPC for protecting the circuit block CB against ESD via the first wiring group W1. The protection circuit EPC includes a diode element, for example. Moreover, the protection circuit EPC is connected to a second wiring group (second wiring to the circuit block CB) W2 in the multilayered wiring layer MWL and connected to the circuit block CB via the second wiring group W2. In other words, the pad 12A is connected to the circuit block CB via the protection circuit EPC.

Specifically, the pad 12A is formed in the third metal wiring layer M3, and the connection part CN1 extends from the pad 12A in the third metal wiring layer M3. A through hole, which passes through the third insulating layer ISL3 and reaches the second metal wiring layer M2, is formed immediately below the connection part CN1. A wire W11 is formed in this through hole. In the second metal wiring layer M2, a wire W12, which extends from the wire W11 toward the outer side of the substrate 11 to reach a region above the protection circuit EPC, is formed.

A through hole, which extends from a surface of the wire W12 closer to the circuit structure layer CSL, passes through the second insulating layer ISL2, and reaches the first metal wiring layer M1, is formed. A wire W13 is formed in this through hole. In the first metal wiring layer M1, a wire W14 connected to the wire W13 is formed. A through hole, which extends from a surface of the wire W14 closer to the substrate 11, passes through the first insulating layer ISL1, and reaches the protection circuit EPC in the circuit structure layer CSL, is formed. A wire W15 is formed in this through hole. In this manner, the pad 12A is connected to the protection circuit EPC via the first wiring group W1.

Next, in the circuit structure layer CSL on the protection circuit EPC where no wire W15 is formed, a through hole, which passes through the circuit structure layer CSL and the first insulating layer ISL1 and reaches the first metal wiring layer M1, is formed. A wire W21 is formed in this through hole. In the first metal wiring layer M1, a wire W22, which extends from the wire W21 to reach a region above the circuit block CB, is formed. A through hole, which passes through the first insulating layer ISL1 and reaches the circuit block CB in the circuit structure layer CSL, is formed on a surface of the wire W22 closer to the circuit structure layer CSL. A wire W23 is formed in this through hole. In this manner, the protection circuit EPC is connected to the circuit block CB via the second wiring group W2.

In FIG. 2A, the second wiring group W2 is illustrated so as to be formed in a region below the pad 12A for ease of comprehension. However, it is desirable that the second wiring group W2 be formed so as to circumvent the region below the pad 12A. When traversing the pad row PL, it is desirable that the wiring in the multilayered wiring layer MWL be formed in a region of the multilayered wiring layer MWL causing no overlap with the pad region as seen from the top, e.g., in a region between the pads.

The wiring configuration illustrated in FIG. 2A is merely an example. For example, the first wiring group W1 may be provided by sequentially forming: a wire, which passes through the third insulating layer ISL3, the second metal wiring layer M2, and the second insulating layer ISL2 and reaches the first metal wiring layer M1, immediately below the first connection part CN1; and a wire, which extends from the wire in the first metal wiring layer M1, passes through the first insulating layer ISL1, and reaches the protection circuit EPC. Alternatively, the second wiring group W2 may be provided by sequentially forming: a wire, which extends from the protection circuit EPC, passes through the first insulating layer ISL1, and reaches the first metal wiring layer M1; a wire, which goes through a region between the pads in the same wiring layer, i.e., the first metal wiring layer M1 and reaches the region above the circuit block CB; and a wire, which passes through the first insulating layer ISL1 and reaches the circuit block CB.

Next, an example of connection between the second pad 12B and the circuit block CB will be described with reference to FIG. 2B. The second pad 12B is connected to a third wiring group (third wiring to the circuit block CB) W3 in the multilayered wiring layer MWL by means of the connection part CN2 thereof. The second pad 12B is connected to the circuit block CB via the third wiring group W3.

Specifically, the pad 12B is formed in the third metal wiring layer M3, and the connection part CN2 extends from the pad 12B in the third metal wiring layer M3. A through hole, which passes through the third insulating layer ISL3 and reaches the second metal wiring layer M2, is formed immediately below the connection part CN2. A wire W31 is formed in this through hole. In the second metal wiring layer M2, a wire W32, which extends from the wire W31 and reaches a region above the circuit block CB, is formed.

A through hole, which extends from a surface of the wire W32 closer to the circuit structure layer CSL, passes through the second insulating layer ISL2, and reaches the first metal wiring layer M1, is formed. A wire W33 is formed in this through hole. In the first metal wiring layer M1, a wire W34 connected to the wire W33 is formed. A through hole, which extends from a surface of the wire W34 closer to the substrate 11, passes through the first insulating layer ISL1, and reaches the circuit block CB in the circuit structure layer CSL, is formed. A wire W35 is formed in this through hole. In this manner, the pad 12B is connected to the circuit block CB via the third wiring group W3.

Note that the wiring configuration illustrated in FIG. 2B is merely an example. For example, the third wiring group W3 may be formed in the following manner depending on arrangement of other wiring and circuit. First, a wire, which passes through the third insulating layer ISL3, the second metal wiring layer M2, and the second insulating layer ISL2 and reaches the first metal wiring layer M1, is formed immediately below the connection part CN2. Subsequently, a wire, which extends toward the circuit block CB in the first metal wiring layer M1, is formed. Next, a wire, which extends from the first metal wiring layer M1, passes through the second insulating layer ISL2, and reaches the second metal wiring layer M2 (in a direction opposite to the substrate 11), is formed. Subsequently, a wire, which goes through the second metal wiring layer M2 to reach a region above the circuit block CB, is formed. A wire, which passes through the second insulating layer ISL2, the first metal wiring layer M1, and the first insulating layer ISL1 and reaches the inside of the circuit structure layer CSL, is then formed. In other words, wiring may be formed so as to be routed through the wiring layers in the up-and-down directions.

Here, a difference between the first pad 12A and the second pad 12B, i.e., a difference between extending directions of the connection parts CN1 and CN2, will be described. In the pad group 12, whether to form the first pad 12A or the second pad 12B, i.e., which direction the connection part is extended from the pad, can be determined (selected) in view of the wiring efficiency.

Specifically, as in the first pad 12A, for example, when the pad 12A needs to be connected to the protection circuit EPC positioned on the outer side of the substrate 11 with respect to the pad 12A as seen from the top, it is desirable that the connection part CN1 thereof be formed (extended) on the side of the protection circuit EPC, i.e., on the outer side of the substrate 11 as seen from the pad 12A.

As in the second pad 12B, on the other hand, when the pad 12B needs to be connected to the circuit block CB positioned on the inner side of the substrate 11 with respect to the pad 12B, it is desirable that the connection part CN2 thereof be formed (extended) on the side of the circuit block CB, i.e., on the inner side of the substrate 11 as seen from the pad 12B.

By determining the formation positions of the connection parts CN1 and CN2 in the pads as described above, a reduced wiring distance, a reduced number of metal wiring layers, an optimized wiring efficiency, and overall reduction in chip size can be achieved. By setting the formation positions of the pads so as to be shifted from each other in the short direction of the pad row PL as in the pads 12A and 12B, the overall layout of the pads and the connection parts (extended parts) is optimized, thereby further reducing the chip size.

A certain distance needs to be provided between the pad group 12 and an end of the substrate 11. Specifically, a bonding wire is formed on the pad 12A. In a step of this wire bonding, a bonding head of a bonding apparatus is brought into contact with the pad. Thus, force pressing down the device is applied from the pad 12A toward the substrate 11. If the pad group 12 is positioned too close to the end of the substrate 11, a risk of damaging the multilayered wiring layer MWL or the substrate 11 is increased in the wire bonding step. Thus, the pad group 12 needs to be formed at a certain distance from the end of the substrate 11.

A region of the multilayered wiring layer MWL positioned between the pad group 12 and the end of the substrate 11 can be used as a wiring region. Thus, such a region can be effectively utilized by forming wires such as the above-described surface wires 13. Similarly, in a region of the circuit structure layer CSL and the substrate 11 positioned between the pad group 12 and the end of the substrate 11, a semiconductor circuit can be formed. It is preferable that the protection circuit EPC be formed in this region of the circuit structure layer CSL and the substrate 11. Forming the protection circuit EPC in a region closer to the end of the substrate 11 can improve the wiring efficiency. Furthermore, by physically distancing the protection circuit EPC from the circuit block CB, which is an ESD protected circuit, the ESD protection efficiency can be improved.

Thus, the protection circuit EPC is formed at a position opposite to the circuit block CB with respect to the pad 12A. Moreover, in view of the wiring efficiency, it is desirable that the connection part CN1 of the pad 12A be extended (formed) in the first direction DR1, i.e., on the side of the protection circuit EPC.

In the present embodiment, the second pad 12B is not connected to the protection circuit EPC. This is because the pad 12B is a pad unnecessary to be connected to the protection circuit EPC. Specifically, the pad 12B is a pad not designed for external connection. The pad 12B is a non-bonding pad in which no bonding wire is formed thereon. For example, the second pad 12B is a pad used for externally applying a power-supply voltage to the circuit block CB upon a functional test (burn-in test, for example) at the time of manufacturing. Also, the pad 12B is a pad used for monitoring an internal power supply in the circuit block CB, for example.

Thus, the second pad 12B is connected to the circuit block CB with no intervention of the protection circuit EPC in the present embodiment. Thus, in view of the wiring efficiency, it is desirable that the connection part CN2 of the pad 12B be extended in the second direction DR2 (direction opposite to the first direction DR1), i.e., on the side of the circuit block CB. Note that when no bonding wire is formed in the pad 12B, the pad size thereof can be made smaller than that of the pad 12A. This makes it possible to reduce (shorten) the distance of the pad group 12 along the longitudinal direction of the pad row PL.

Note that the arrangement order of the pads 12A and 12B in the pad group 12 can be determined in view of the efficiency of wiring to the circuit block CB. For example, the pads 12B may be first disposed in view of the wiring distance to the circuit block CB from the pad 12B, and then other pads 12A may be formed between the pads 12B. Alternatively, pads constituting the opposite ends of the pad group 12 may be the pads 12B and pads positioned therebetween may be the pads 12A. Alternatively, the pads 12B may be formed in a scattering manner in the middle of the pad group 12.

Figure 3:
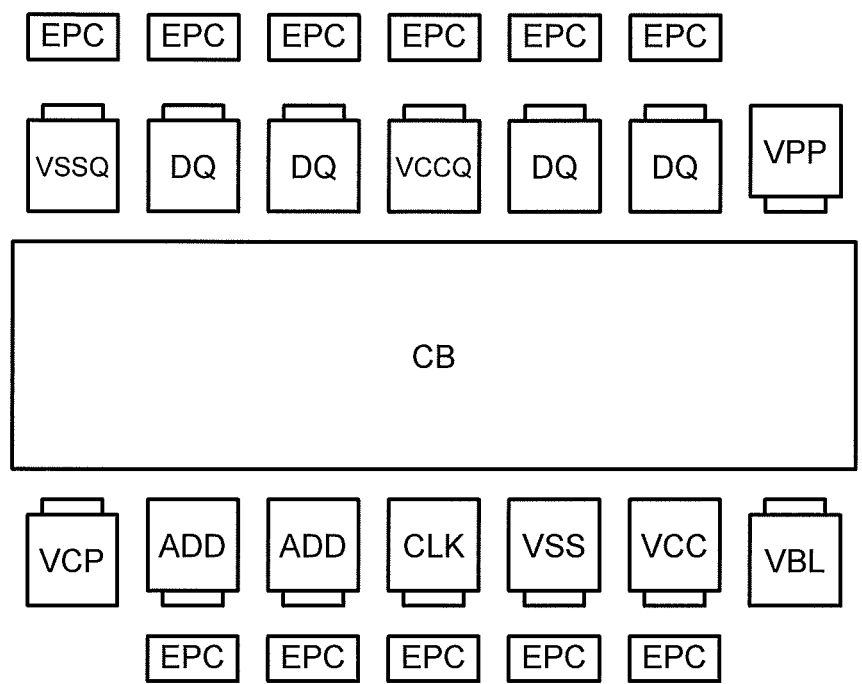
FIG. 3 is a top view schematically illustrating a specific example of pads and an arrangement example of protection circuits in the semiconductor device according to the first embodiment.

FIG. 3 is a top view schematically illustrating arrangement of pads and protection circuits in the semiconductor device 10. First, specific examples of the pad 12A connected to the circuit block CB via the protection circuit EPC and the pad 12B directly connected to the circuit block CB with no intervention of the protection circuit EPC will be described with reference to FIG. 3. In the present embodiment, DQ pads, a VSSQ pad, a VCCQ pad, ADD pads, a CLK pad, a VSS pad, and a VCC pad are each formed as the pad 12A.

The DQ pad is a pad used for inputting and outputting data into and from the circuit block. The VCCQ pad and the VSSQ pad are pads used for applying a power-supply potential and a ground potential, respectively, to the circuit block CB upon inputting and outputting data. The ADD pad is a pad used for assigning an address where inputting and outputting of data are performed. The CLK pad is a pad used for inputting and outputting a clock signal into and from the circuit block CB. The VCC and VSS pads are pads used for applying a power-supply potential and a ground potential, respectively, to the circuit block CB. These pads 12A are connected to an external device via the bonding wires, and external signals are inputted into and outputted from these pads during a normal operation. Thus, the pads 12A are connected to the protection circuits EPC.

Moreover, in the present embodiment, a VPP pad, a VCP pad, and a VBL pad are formed as the pads 12B. The VPP pad is a pad used for applying a high power-supply potential (boosting potential) to the circuit block CB upon inputting and outputting data. The VCP pad is a pad used for applying a potential to a plate line in the circuit block CB. The VBL pad is a pad used for applying a potential to a bit line in the circuit block CB. These pads 12B are directly connected to the circuit block CB. Although not illustrated in the figure, a VMON pad used for monitoring a potential in the circuit block CB may be additionally formed as the pad 12B.

Next, the arrangement of the protection circuits EPC will be described. In view of the wiring efficiency, it is desirable that the protection circuit EPC be provided at a position opposed to the connection part CN1 of the pad 12A as seen from the top. Moreover, it is desirable that the protection circuits EPC be arranged in the same direction along the arrangement direction of the pads 12A and aligned in a row. This is because forming the same type of circuits in alignment simplifies wiring, thus contributing to reduction in device size.

Although the present embodiment has described the case where the connection parts CN1 and CN2 are formed along the direction perpendicular to the longitudinal direction of the pad row PL, the formation positions of the connection parts CN1 and CN2 are not limited thereto. For example, some pads in the pad group may be connected only to connection parts extended along the longitudinal direction of the pad row PL. Alternatively, the pad 12A may be connected to a connection part extended along the longitudinal direction of the pad row PL as well as to the connection part CN1, for example.

Moreover, although the present embodiment has described the case where the circuit block CB is formed in the central part of the substrate 11 and the pad groups 12 are formed along the peripheries of the circuit block CB, the positional relationship between the circuit block CB and the pad group 12 is not limited thereto. For example, two circuit blocks may be formed and a pad group may be formed in a central part between the two circuit blocks. Moreover, although the present embodiment has described the case where the pad groups 12 are formed along the two opposed sides of the substrate 11, the formation position of the pad group 12 is not limited thereto. For example, the pad group may be formed so as to surround the circuit block CB.

Modified Example

Figure 4:
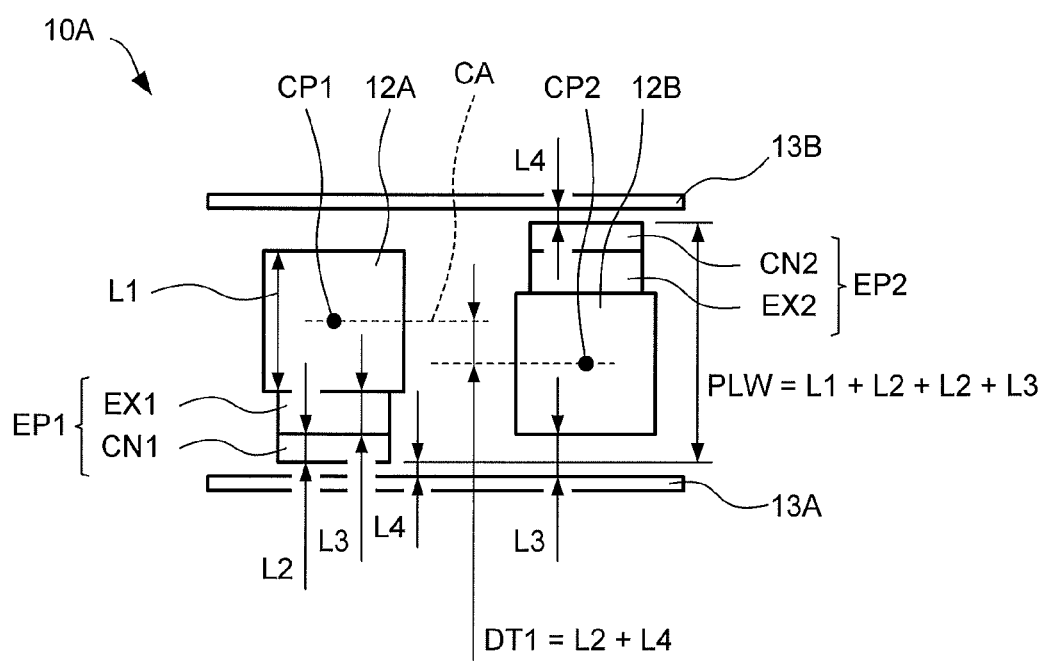
FIG. 4 is a partial enlarged view of a semiconductor device according to a modified example of the first embodiment.

FIG. 4 is a top view illustrating a configuration of a semiconductor device 10A according to a modified example of the first embodiment. The semiconductor device 10A has the same configuration as the semiconductor device 10 except for formation positions of the pads 12A and 12B and structures of extended parts EP1 and EP2. Note that FIG. 4 only shows a single pad 12A and the extended part EP1 thereof, a single pad 12B and the extended part EP2 thereof, and a pair of surface wires 13A and 13B, and illustration of other components is omitted.

In the present modified example, the pads are arranged in view of a distance between the surface wire 13A and the pad 12B and between the surface wire 13B and the pad 12A as well as a distance between the pad 12A and the connection part CN1 and between the pad 12B and the connection part CN2. More specifically, in view of a manufacturing error in bonding position upon wire bonding, a certain distance needs to be provided between the pad 12A and the connection part CN1 (between the pad 12A and the wire W11 of the wiring W1 in the device). Similarly, a certain distance also needs to be provided between the pad 12A and the surface wire 13B. Such a distance becomes more non-negligible as a wire width and a wire interval, for example, are made finer. If the pads and the connection parts as well as the pads and the surface wires are formed with an interval smaller than such a required distance, the bonding wires and the wires may be short-circuited, thus resulting in connection failure.

In the present modified example, the required distance between the pad and the wire is referred to as a pad-wire distance L3. Although a certain distance needs to be provided also between the connection part CN1 and the first surface wire 13A, such a distance requires no consideration in positional misalignment at the time of wire bonding. Thus, it is only required that the connection part CN1 and the first surface wire 13A are spaced apart from each other by a distance L4 smaller than the distance L3.

In the present modified example, the pad 12A and the connection part CN1 are formed with the distance L3 provided therebetween. Specifically, an extension part (first extension part) EX1 for connecting between the pad 12A and the connection part CN1 is formed between the pad 12A and the connection part CN1. A length of the extension part EX1 (extension part length) along the short direction of a pad row PL is at least equal to the distance L3. Note that the connection part CN1 and the extension part EX1 are collectively referred to as the extended part (first extended part) EP1 in the present modified example. In other words, the pad 12A is provided with the extended part EP1 extended in the first direction DR1 from the pad 12A, and the extended part EP1 is constituted by the connection part CN1 and the extension part EX1.

Similarly, the pad 12B is provided with the extended part (second extended part) EP2 extended in the second direction DR2 from the pad 12B, and the extended part EP2 includes the connection part CN2 and an extension part (second extension part) EX2. Moreover, the connection part CN2 of the extended part EP2 and the second surface wire 13B are spaced apart from each other by the distance L4. No wiring to the circuit block CB is formed immediately below the extension parts EX1 and EX2. Such wiring is formed immediately below the connection parts CN1 and CN2.

Although the present modified example has described the case where the extension part EX1 and the connection part CN1 together constitute the extended part EP1 and the extension part EX2 and the connection part CN2 together constitute the extended part EP2, the extended parts EP1 and EP2 may be constituted only by the connection parts CN1 and CN2, respectively. Specifically, the pad 12A and the extension part EX1 extended in the first direction DR1 from the pad 12A by the distance L3 may constitute the first pad, and the connection part CN1 extended in the first direction DR1 from the extension part EX1 by the distance L2 may constitute the first extended part EP1. Similarly, the pad 12B and the extension part EX2 extended in the second direction DR2 from the pad 12B by the distance L3 may constitute the second pad, and the connection part CN2 extended in the second direction DR2 from the extension part EX2 by the distance L2 may constitute the second extended part EP2.

In the present modified example, the pad 12B is formed at a position moved (shifted) in the first direction DR1 from the longitudinal direction (central axis CA) of the pad row PL passing through the center point CP1 of the pad 12A by a distance equal to addition of the connection part length L2 and the distance between the connection part CN1 and the first surface wire 13A (connection part-wire distance) L4. Specifically, the center point CP2 of the pad 12B is formed at a position shifted from the central axis CA by the distances L2 and L4. Here, the width PLW of the pad row PL equals (the pad length L1)+(the connection part length L2)+(the connection part length L2)+(the extension part length L3). This is the configuration having the smallest pad row width PLW also in view of the pad-wire distance.

Thus, when the required interval between the pad and the wire in view of positional misalignment upon bonding is non-negligible, the pad row width PLW can be minimized by shifting the position of the pad 12B from the pad 12A by the distance equal to the connection part length L2 and the connection part-wire distance L4.

As described above, when the connection parts are extended in the opposite directions from the pads, the pad layout including the connection parts (extended parts) is optimized by shifting the positions of the pads from each other in the short direction of the pad row PL by the length of the connection part and reduction in device size can be thus achieved.

This application is based on a Japanese Patent application No. 2014-145152 which is hereby incorporated by reference.

What is claimed is:

1. A semiconductor device comprising:
    at least one pad group including a plurality of pads provided on a semiconductor substrate and arranged in a row to form a pad row as a whole, wherein
    said pad group includes: a plurality of first pads provided with a first via-connection part electrically connected therewith; and a plurality of second pads provided with a second via-connection part electrically connected therewith;
    said plurality of first pads are positioned so that each center point of said plurality of first pads is arranged along a first center line,
    said plurality of second pads are positioned so that each center point of said plurality of second pads is arranged along a second center line,
    said first via-connection part extends in a first direction perpendicular to the first center line,
    said second via-connection part extends in a second direction opposite to the first direction,
    the first and second center lines are positioned in parallel with each other and apart from each other, and
    said first and second via-connection parts are connected to a circuit block provided in said semiconductor substrate.

2. The semiconductor device according to claim 1, wherein the first and second center lines are apart from each other by a length substantially equal to a connection part length of said first via-connection part.

3. The semiconductor device according to claim 2, wherein each of said plurality of pads has the same length in the first direction, and the connection part length is smaller than the pad length of said pads along the first direction.

4. The semiconductor device according to claim 1, wherein said first pad is connected to a protection circuit for protecting said circuit block from electro static discharge, and said first pad is connected to said circuit block via said protection circuit.

5. The semiconductor device according to claim 1, wherein said second pad is a non-bonding pad in which no bonding wire is formed on said second pad.

6. The semiconductor device according to claim 4, wherein said semiconductor substrate has a rectangular shape as seen from a direction perpendicular to said semiconductor substrate, said circuit block is formed in a central part of said semiconductor substrate, said pad group is formed outside said circuit block along two opposed sides of said semiconductor substrate, said protection circuit is formed between said pad group and a peripheral portion of said semiconductor substrate, and the first direction is a direction directed to an outer side of said semiconductor substrate as seen from said first pad.

7. A semiconductor device comprising:
    at least one pad group including a plurality of pads provided on a semiconductor substrate and arranged in a row to form a pad row as a whole, wherein
    said pad group includes: a plurality of first pads provided with a first via-connection part electrically connected therewith; and a plurality of second pads provided with a second via-connection part electrically connected therewith;
    said plurality of first pads are positioned so that each center point of said plurality of first pads is arranged along a first center line,
    said plurality of second pads are positioned so that each center point of said plurality of second pads is arranged along a second center line,
    said first via-connection part extends in a first direction along a side of said first pad intersecting to the first center line,
    said second via-connection part extends in a second direction opposite to the first direction,
    the first and second center lines are positioned in parallel with each other and apart from each other, and
    said first and second via-connection parts are connected to a circuit block provided in said semiconductor substrate.

8. The semiconductor device according to claim 7, wherein the first and second center lines are apart from each other by a length substantially equal to a connection part length of said first via-connection part.

9. The semiconductor device according to claim 8, wherein each of said plurality of pads has the same length in the first direction, and the connection part length is smaller than the pad length of said pads along the first direction.

10. The semiconductor device according to claim 7, wherein said first pad is connected to a protection circuit for protecting said circuit block from electro static discharge, and said first pad is connected to said circuit block via said protection circuit.

11. The semiconductor device according to claim 7, wherein said second pad is a non-bonding pad in which no bonding wire is formed on said second pad.

12. The semiconductor device according to claim 10, wherein said semiconductor substrate has a rectangular shape as seen from a direction perpendicular to said semiconductor substrate, said circuit block is formed in a central part of said semiconductor substrate, said pad group is formed outside said circuit block along two opposed sides of said semiconductor substrate, said protection circuit is formed between said pad group and a peripheral portion of said semiconductor substrate, and the first direction is a direction directed to an outer side of said semiconductor substrate as seen from said first pad.

* * * * *